(12) United States Patent
Courtin et al.

(10) Patent No.: US 11,232,239 B2
(45) Date of Patent: Jan. 25, 2022

(54) SYSTEM AND METHOD FOR AIRCRAFT DESIGN OPTIMIZATION AND PERFORMANCE

(71) Applicant: Aurora Flight Sciences Corporation, Manassas, VA (US)

(72) Inventors: Christopher Courtin, Manassas, VA (US); Cory Kays, Manassas, VA (US)

(73) Assignee: Aurora Flight Sciences Corporation, Manassas, VA (US)

( * ) Notice: Subject to any disclaimer, the term of this patent is extended or adjusted under 35 U.S.C. 154(b) by 849 days.

(21) Appl. No.: 16/022,183

(22) Filed: Jun. 28, 2018

(65) Prior Publication Data
US 2019/0005184 A1    Jan. 3, 2019

Related U.S. Application Data

(60) Provisional application No. 62/527,144, filed on Jun. 30, 2017.

(51) Int. Cl.
*G06F 30/15* (2020.01)
*B64F 5/60* (2017.01)
*G06F 30/20* (2020.01)

(52) U.S. Cl.
CPC .............. *G06F 30/15* (2020.01); *B64F 5/60* (2017.01); *G06F 30/20* (2020.01)

(58) Field of Classification Search
CPC . B64F 5/60; G06F 30/00; G06F 30/15; G06F 30/20
USPC .......................................... 703/8, 6
See application file for complete search history.

(56) References Cited

U.S. PATENT DOCUMENTS

| | | | | |
|---|---|---|---|---|
| 2006/0058985 | A1* | 3/2006 | Arslan | G06F 30/15 703/2 |
| 2014/0372093 | A1* | 12/2014 | Takami | G06F 30/15 703/8 |
| 2015/0203215 | A1* | 7/2015 | Falangas | B64F 5/00 703/2 |

OTHER PUBLICATIONS

Prakasha, Prajwal Shiva et al., "Assessment of Airframe-Subsystems Synergy on Overall Aircraft Performance in a Collaborative Design Environment", Jun. 13-17, 2016, AIAA Aviation Forum, American Institute of Aeronautics and Astronautics. (Year: 2016).*

(Continued)

*Primary Examiner* — Cedric Johnson
(74) *Attorney, Agent, or Firm* — Michael Stanley Tomsa; McAndrews, Held & Malloy, Ltd.; Eugene H. Nahm (57) ABSTRACT

An aircraft design optimization system and associated aircraft design optimization architecture. The aircraft design optimization system may comprise an input circuit to provide input data and an optimizer circuit to receive the input data and to communicate with a plurality of modules to create output data. At least one abstraction layer can be provided between the optimizer circuit and each of the plurality of modules. The optimizer circuit is configured to output the output data to a post-processing circuit. Each of the plurality of modules implements a different function.

22 Claims, 7 Drawing Sheets

(56) References Cited

OTHER PUBLICATIONS

Gur, Ohad et al, "Design Optimization of a Truss-Braced-Wing Transonic Transport Vehicle", Nov.-Dec. 2010, Journal of Aircraft, vol. 47, No. 6. (Year: 2010).*
The MIT, Aurora Flight Sciences, and Pratt & Whitney Team, E. M. Greitzer, and H. N. Slater, vol. 2: Appendices—Design Methodologies for Aerodynamics, Structures, Weight, and Thermodynamic Cycles Final Report, Mar. 31, 2010.

\* cited by examiner

SYSTEM AND METHOD FOR AIRCRAFT DESIGN OPTIMIZATION AND PERFORMANCE

CROSS-REFERENCE

The present application claims the benefit under 35 U.S.C. § 119(e) of U.S. Provisional Patent Application Ser. No. 62/527,144, filed Jun. 30, 2017 and titled "System And Method For Aircraft Design Optimization And Performance," the contents of which are hereby incorporated by reference.

FIELD

The present disclosure relates to an aircraft design optimization system and associated aircraft design optimization architecture.

BACKGROUND

Many incompatible conceptual aircraft design optimization system exist, each targeted towards one specific goal. Traditionally, performance tools are developed for a specific class of aircraft, type of mission, and/or methods of analysis, and hence underlying assumptions about the problem are built into the system in a manner that prohibit adaption of the system to other problems. Moreover, existing aircraft design optimization systems are written in a variety of languages.

Consequently, it is difficult to employ a one-size-fits-all approach to aircraft development systems because configurations, missions, technologies, and models can vary widely. Therefore, what is needed is a tool development architecture and environment to provide to the user seamless access to, and be able to build upon, all the work done by previous aircraft design programs. In other words, a need exists for a modular aircraft design optimization and performance tool and framework to enable a useable framework without restricting flexibility.

SUMMARY

The present disclosure is directed to an aircraft design optimization system provides a novel way of defining the architecture for aircraft design, optimization, and performance tools. The disclosed aircraft design optimization system provides a level of abstraction to the architecture to enable simple reconfiguration of aircraft type, mission, or analysis type, which enables system reuse and much faster analysis times on new aircraft endeavors.

According to a first aspect, an aircraft design optimization system comprises: an input circuit to provide input data relating to an initial aircraft; and an optimizer circuit to receive the input data and to communicate with a plurality of modules to create output data relating to a modified aircraft based at least in part on the input data, wherein at least one abstraction layer is provided between the optimizer circuit and each of the plurality of modules, and wherein the optimizer circuit is configured to output the output data to a post-processing circuit.

In certain aspects, each of the plurality of modules implements a different function.

In certain aspects, the input data includes an aircraft data structure.

In certain aspects, the input data includes a mission data structure.

In certain aspects, the output data includes an aircraft data structure and a mission data structure.

In certain aspects, the output data includes a mission history data structure.

According to a second aspect, an aircraft design optimization system comprises: an optimizer circuit configured to receive initial aircraft (IA) data and initial mission (IM) data relating to an initial aircraft design for an aircraft; a vehicle sizing circuit and a secondary model circuit operatively coupled with the optimizer circuit to generate, via a processor-controlled design optimization convergence loop, aircraft (A) data and mission (M) data relating to a modified aircraft design for the aircraft, wherein the vehicle sizing circuit is configured to provide mission history (MH) data to the optimizer circuit and the secondary model circuit is configured to provide model output (MO) data to the optimizer circuit based at least in part on the initial aircraft (IA) and initial mission (IM) data; and an objective module operatively coupled with the optimizer circuit and configured to generate objective data (OD) reflecting an objective function based at least in part on the aircraft (A) data, the mission (M) data, the mission history (MH) data, and the model output (MO) data received from the optimizer circuit, wherein the optimizer circuit configured to output the aircraft (A) data, the mission (M) data, and the mission history (MH) data to a post-processing circuit based at least in part on the objective data (OD).

In certain aspects, the objective module is operatively coupled with the optimizer circuit via at least one abstraction layer.

In certain aspects, the initial aircraft (IA) data includes an aircraft data structure and the initial mission (IM) data includes a mission data structure.

In certain aspects, the vehicle sizing circuit employs a residual convergence loop to modify aircraft (A) data and mission (M) data.

In certain aspects, the vehicle sizing circuit comprises a geometry definition circuit configured to modify the aircraft (A) data and mission (M) data as a function of a geometry data object (DO).

In certain aspects, the vehicle sizing circuit comprises a weight definition circuit configured to modify the aircraft (A) data and mission (M) data as a function of a weight data object (DO).

In certain aspects, the vehicle sizing circuit comprises a mission integration circuit configured to generate the mission history (MH) data as a function of the aircraft (A) data and mission (M) data via a mission convergence loop.

In certain aspects, the mission integration circuit uses a weight definition circuit to generate the mission history (MH) data as a function of a fuel requirement or a range requirement of the aircraft.

In certain aspects, the mission convergence loop employs, for a given mission, drag abstraction, atmosphere abstraction, and propulsion abstraction.

In certain aspects, the vehicle sizing circuit comprises a residual calculation circuit configured to generate a residual data (RD) value as a function of the initial aircraft (IA) data, the initial mission (IM) data, the mission history (MH) data, the aircraft (A) data, and the mission (M) data.

In certain aspects, the residual calculation circuit is configured to output modified aircraft (A) data and mission (M) data to the optimizer circuit if the residual data (RD) value is substantially zero.

In certain aspects, the vehicle sizing circuit comprises a non-linear solver circuit, wherein the residual calculation circuit is configured to output modified aircraft (A) data and mission (M) data to the non-linear solver circuit if the residual data (RD) value is not substantially zero, wherein the non-linear solver circuit is configured to adjust the modified aircraft (A) data and mission (M) data until the residual data (RD) value is substantially zero.

In certain aspects, the vehicle sizing circuit comprises a geometry definition circuit, a weight definition circuit, a mission integration circuit, a residual calculation circuit, and a non-linear solver circuit.

According to a third aspect, a method for optimizing an aircraft design comprises: receiving, via an optimizer circuit, initial aircraft (IA) data and initial mission (IM) data relating to an initial aircraft design for an aircraft; generating, via a processor-controlled design optimization convergence loop, aircraft (A) data and mission (M) data relating to a modified aircraft design for the aircraft, wherein the processor-controlled design optimization convergence loop employs a vehicle sizing circuit and a secondary model circuit operatively coupled with the optimizer circuit; providing, via the vehicle sizing circuit, mission history (MH) data to the optimizer circuit based at least in part on the initial aircraft (IA) and initial mission (IM) data; providing, via the secondary model circuit, model output (MO) data to the optimizer circuit based at least in part on the initial aircraft (IA) and initial mission (IM) data; generating objective data (OD), via an objective module, reflecting an objective function based at least in part on the aircraft (A) data, the mission (M) data, the mission history (MH) data, and the model output (MO) data received from the optimizer circuit, wherein the objective module is operatively coupled with the optimizer circuit; and outputting, via the optimizer circuit, the aircraft (A) data, the mission (M) data, and the mission history (MH) data to a post-processing circuit based at least in part on the objective data (OD).

In certain aspects, the method further comprises the step of modifying, via a geometry definition circuit, the aircraft (A) data and mission (M) data as a function of a geometry data object (DO).

In certain aspects, the method further comprises the step of modifying, via a weight definition circuit, the aircraft (A) data and mission (M) data as a function of a weight data object (DO).

In certain aspects, the method further comprises the step of generating, via a mission integration circuit using a mission convergence loop, the mission history (MH) data as a function of the aircraft (A) data and mission (M) data.

In certain aspects, the mission integration circuit uses a weight definition circuit to generate the mission history (MH) data as a function of a fuel requirement or a range requirement of the aircraft.

In certain aspects, the mission convergence loop employs, for a given mission, drag abstraction, atmosphere abstraction, and propulsion abstraction.

In certain aspects, the method further comprises the step of generating, via a residual calculation circuit, a residual data (RD) value as a function of the initial aircraft (IA) data, the initial mission (IM) data, the mission history (MH) data, the aircraft (A) data, and the mission (M) data.

In certain aspects, the method further comprises the step of outputting, via the residual calculation circuit, modified aircraft (A) data and mission (M) data to the optimizer circuit if the residual data (RD) value is substantially zero.

In certain aspects, the method further comprises the step of outputting, via the residual calculation circuit, modified aircraft (A) data and mission (M) data to a non-linear solver circuit if the residual data (RD) value is not substantially zero, wherein the non-linear solver circuit is configured to adjust the modified aircraft (A) data and mission (M) data until the residual data (RD) value is substantially zero.

DRAWINGS

These and other advantages of the present disclosure will be readily understood with the reference to the following specifications and attached drawings wherein.

DETAILED DESCRIPTION

Preferred embodiments of the present disclosure will be described hereinbelow with reference to the accompanying drawings. The components in the drawings are not necessarily drawn to scale, the emphasis instead being placed upon clearly illustrating the principles of the present embodiments. For instance, the size of an element may be exaggerated for clarity and convenience of description. Moreover, wherever possible, the same reference numbers are used throughout the drawings to refer to the same or like elements of an embodiment. In the following description, well-known functions or constructions are not described in detail because they may obscure the disclosure in unnecessary detail. No language in the specification should be construed as indicating any unclaimed element as essential to the practice of the embodiments. For this application, the following terms and definitions shall apply:

As used herein, the words "about" and "approximately," when used to modify or describe a value (or range of values), mean reasonably close to that value or range of values. Thus, the embodiments described herein are not limited to only the recited values and ranges of values, but rather should include reasonably workable deviations.

The terms "aerial vehicle" and "aircraft" refer to a machine capable of flight, including, but not limited to, fixed-wing aircraft, unmanned aerial vehicle, variable wing aircraft, and vertical take-off and landing (VTOL) aircraft. VTOL aircraft may include fixed-wing aircraft (e.g., Harrier jets), rotorcraft (e.g., helicopters), tilt-rotor/tilt-wing aircraft, etc.

As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y, and/or z" means "one or more of x, y, and z."

The terms "communicate" and "communicating," as used herein, refer to both transmitting, or otherwise conveying, data from a source to a destination and delivering data to a communications medium, system, channel, network, device, wire, cable, fiber, circuit, and/or link to be conveyed to a destination.

The terms "coupled," "coupled to," and "coupled with" as used herein, each mean a relationship between or among two or more devices, apparatuses, files, circuits, elements, functions, operations, processes, programs, media, components, networks, systems, subsystems, and/or means, constituting any one or more of: (1) a connection, whether direct or through one or more other devices, apparatuses, files, circuits, elements, functions, operations, processes, programs, media, components, networks, systems, subsystems, or means; (2) a communications relationship, whether direct or through one or more other devices, apparatuses, files, circuits, elements, functions, operations, processes, programs, media, components, networks, systems, subsystems, or means; and/or (3) a functional relationship in which the operation of any one or more devices, apparatuses, files, circuits, elements, functions, operations, processes, programs, media, components, networks, systems, subsystems, or means depends, in whole or in part, on the operation of any one or more others thereof.

The terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first set of one or more lines of code and may comprise a second "circuit" when executing a second set of one or more lines of code. As utilized herein, circuitry is "operable" to perform a function whenever the circuitry comprises the necessary hardware and code stored to a computer readable medium, such as a memory device (if any is necessary) to perform the function, regardless of whether performance of the function is disabled or not enabled (e.g., by an operator-configurable setting, factory trim, etc.).

The term "data" as used herein means any indicia, signals, marks, symbols, domains, symbol sets, representations, and any other physical form or forms representing information, whether permanent or temporary, whether visible, audible, acoustic, electric, magnetic, electromagnetic, or otherwise manifested. The term "data" is used to represent predetermined information in one physical form, encompassing any and all representations of corresponding information in a different physical form or forms.

The term "exemplary" means serving as a non-limiting example, instance, or illustration. Likewise, the terms "e.g." and "for example" set off lists of one or more non-limiting examples, instances, or illustrations.

The term "network" as used herein includes both networks and inter-networks of all kinds, including the Internet, and is not limited to any particular network or inter-network.

The term "processor" as used herein means processing devices, apparatuses, programs, circuits, components, systems, and subsystems, whether implemented in hardware, tangibly embodied software, or both, and whether or not it is programmable. The term "processor" as used herein includes, but is not limited to, one or more computing devices, hardwired circuits, signal-modifying devices and systems, devices and machines for controlling systems, central processing units, programmable devices and systems, field-programmable gate arrays, application-specific integrated circuits, systems on a chip, systems comprising discrete elements and/or circuits, state machines, virtual machines, data processors, processing facilities, and combinations of any of the foregoing.

The disclosed aircraft design optimization system provides a modular aircraft design optimization and performance tool and framework to facilitate design, development, and analysis of aerial vehicles. The disclosed aircraft design optimization architecture offers a comprehensive framework for the design and simulation of virtually any aircraft configuration. The aircraft design optimization architecture is designed to be highly configurable and modular, such that it can be reconfigured and reused across a variety of different aircraft platforms. Indeed, the aircraft design optimization architecture is configurable to a wide variety of different levels of fidelity and functionality. For example, the disclosed aircraft design optimization system can leverage the fact that swarms of aircraft (e.g., unmanned aerial systems (UAS)) may not be designed to operate alone.

Further, the aircraft design optimization architecture is configured to mitigate assumptions, limiting assumptions only to those relating to steady flight, two dimensional (2D) inertial space, and applicability to air vehicle sizing/simulation. By way of illustration, the aircraft design optimization architecture may first assume that the vehicle is in un-accelerated flight at every point in the mission profile. This is useful for simulating missions and sizing vehicles but does not allow for simulation of vehicle dynamics or controls development. Second, the aircraft design optimization architecture may assume that the vehicle is moving in two dimensions (e.g., altitude and range). Finally, the aircraft design optimization architecture may be designed specifically for air vehicle sizing, and, as such, cannot be directly ported to other types of optimization problems.

The aircraft design optimization system may be configured to perform aircraft simulation, aircraft sizing, and aircraft optimization. For example, the aircraft design optimization system may perform one or more aircraft design optimization processes to, inter alia, predict the performance of a given vehicle over a given mission; determine how much an aircraft must weigh in order to perform its intended mission and carry its intended payload, subject to a set of design variables; and determine the set of design variables that give the best aircraft performance on its intended mission.

An advantage of the system architecture employed by the aircraft design optimization system is the inclusion of abstraction layers between the various functions (e.g., modules) of the aircraft design optimization system. As can be appreciated, an abstraction layer enables the aircraft design optimization system to conceal the implementation details of a particular set of system architecture functionality or module (e.g., drag buildup, mission integration, mission definition, etc.), thereby allowing for the separation of concerns to facilitate interoperability and platform independence. A module, as used herein, refers to a circuit operable to perform a particular function, set of functions, or otherwise provide the described system architecture functionality.

In existing system architectures, however, modules are directly linked to the code that performs the mission simulation and overall convergence. For example, mission profiles may be hard-code into program-specific sizing codes because the mission being designed for is usually one of the first requirements of the program. This can make it time-consuming to change assumptions about the mission or details of the profile, which can lead to errors introduced in the code. Additionally, directly linked modules limit the utility of the system for cases with different missions.

By decoupling the core integration and convergence code from the various modules, and defining a few required attributes of each abstraction, the system architecture of the present aircraft design optimization system allows for implementation of changes to any portion of the code without affecting functionality of other parts of the system, or requiring additional modifications beyond changes to the input file. For example, by abstracting away the specifics of the mission definition from the execution of the code, it becomes much quicker and easier to change details of the profile, or even the entire mission type, without the risk of adding errors or the need to change underlying assumptions in the software. In the same way, the fidelity or underlying physics of the various modules can be changed without affecting any other parts of the code. Accordingly, the aircraft design optimization system allows for flexible vehicle configuration, mission redefinition, and easily interchangeable models and levels of fidelity to provide robust mission simulation and vehicle sizing convergence loops, which underlie most vehicle design problems.

Figure 1:
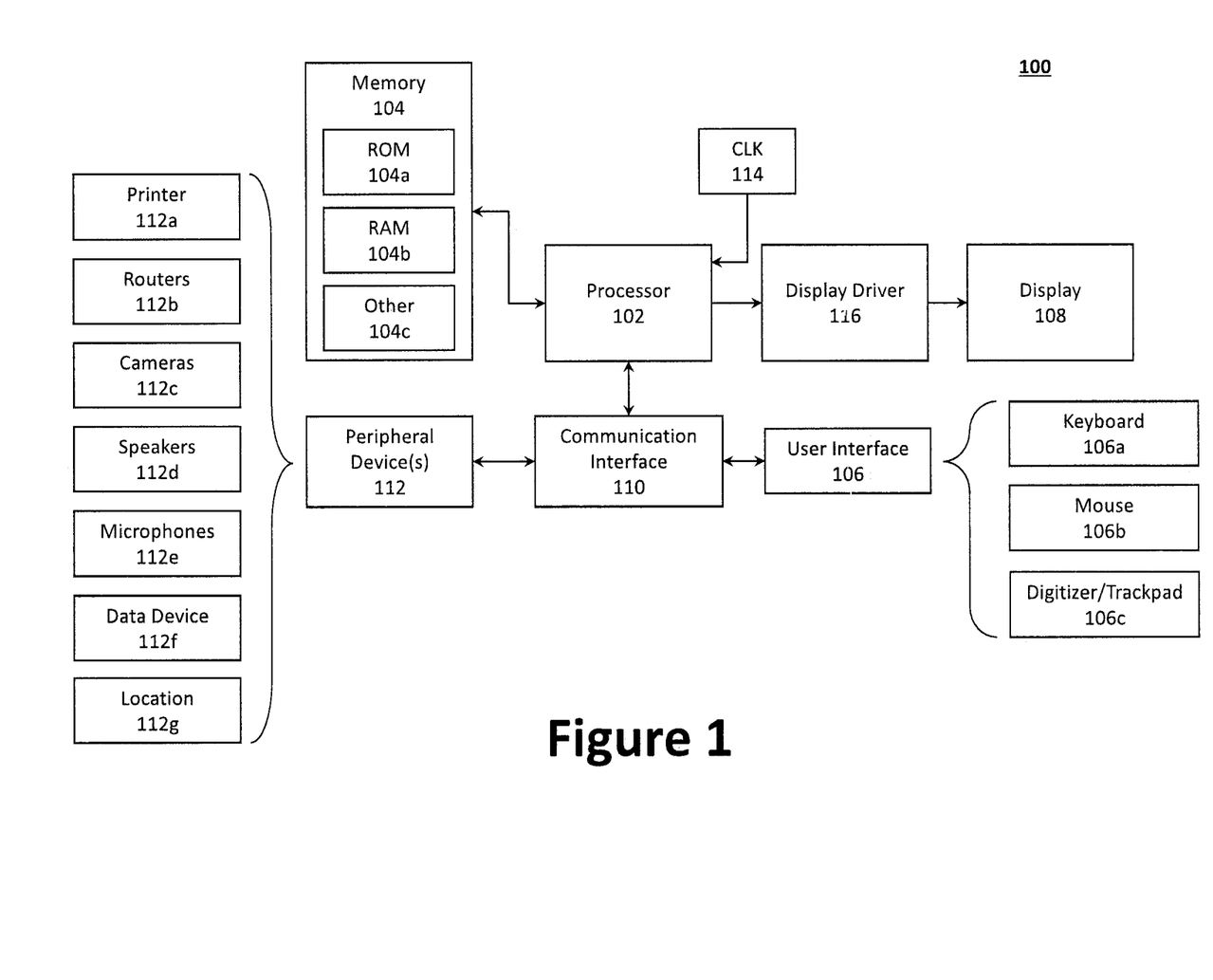
FIG. 1 is a diagram of an example aircraft design optimization system.

FIG. 1 illustrates an example aircraft design optimization system 100 having a processor 102 (e.g., a central processing unit (CPU)) operatively coupled with various hardware components. For example, the processor 102 can be operatively coupled with a memory device 104, a display 108 (via a display driver 116), a user interface 106, a communication interface 110 to communicate with (or otherwise provide an input/output interface) one or more peripheral devices 112 and/or the user interface 106.

The memory device 104 may include, inter alia, a read-only memory (ROM) 104a for receiving one or more instruction sets, a random access memory (RAM) 104b having a plurality of buffers for temporarily storing and retrieving information, and/or other internal data storage devices 104c. The other data storage devices 104c may be, for example, a hard drive (e.g., a solid-state drive or other non-volatile data storage device) or another non-volatile data storage device (e.g., flash memory, including removable memory cards). A clock 114 to provide clock/timing signals or pulses may be coupled to the processor 102.

Those skilled in the art will understand that the aircraft design optimization system 100 includes one or more bus structures for interconnecting its various components of the aircraft design optimization system 100. Further, to increase ease of use in mobile applications (i.e., to increase portability), the various components of an aircraft design optimization system 100 may be housed in a single housing.

The communication interface 110 may include a port to interface the processor 102 with one or more peripheral and/or communicative devices 112 and one or more user interfaces 106. The communication interface 110 may employ on or more cables, connectors and communications protocols, such as Ethernet, FireWire, Universal Serial Bus (USB), RS-232 serial port, parallel port, eSATA, eSATAp, Parallel ATA, Serial ATA (SATA), etc.

The processor 102 may be operatively coupled to a display device 108 via a display driver 116. The display device 108 may comprise one or more light emitting diodes (LEDs), a liquid crystal display (LCD) screen or monitor, and/or a segmented display device. In certain embodiments, the display device 108 may further provide touch screen functionality to facilitate a user input device via a digitizer 106c, such as a thin layer of sensing circuitry present either beneath the visible portion of display device's 108 surface, or as part of a thin, clear membrane overlying the display device 108 that is sensitive to the position of a pen or finger on its surface.

The peripheral and/or communicative devices 112 may include, without limitation, printers 112a, routers 112b, cameras 112c, speakers 112d, microphones 112e, data storage devices 112f (e.g., external hard drives and other non-volatile data storage device), and location services 112g, such as a Global Positioning System (GPS) transmitter. The printer 112a may be a two dimensional (2D) printer (e.g., ink jet, laser, etc.) and/or a three dimensional (3D) printer that employs additive manufacturing to manufacture 3D objects by adding layer-upon-layer of material. Example 3D printing materials including, for example, polyamides (e.g., nylon), thermoplastic polymer materials (e.g., acrylonitrile-butadiene-styrene (ABS)), resin, ferrous material (e.g., steel and stainless steel), precious metals (e.g., gold, silver, etc.), titanium, ceramic, gypsum, etc. In certain aspects, the processor 102 may send or receive instructions to/from a remote user interface (or another peripheral and/or communicative device 112) over a network via the router 112b, whether over a wired link or a wireless link. The user interfaces 106 may include a keyboard 106a, a mouse 106b, a digitizer 106c (whether a touch pad, or transparent layer overlaying the display device 108), buttons, switches, etc.

The processor 102, based at least on part on data received from the communication interface 110 and/or memory device 104, is configured to perform one or more aircraft design optimization processes to, inter alia, predict the performance of a given vehicle over a given mission; determine how much an aircraft must weigh in order to perform its intended mission and carry its intended payload, subject to a set of design variables; and determine the set of design variables that give the best aircraft performance on its intended mission. The one or more aircraft design optimization processes may be provide using programming languages, such as Python, MATLAB, C++, FORTRAN, Julia, etc. The processor 102 may further instruct the printer 112a to generate an aircraft component based at least in part on an output from the aircraft design optimization processes. For example, an aircraft (or component thereof) may be designed, tested, and validated using the aircraft design optimization system 100 and, upon completion, the processor 102 may generate and communicate a corresponding 3D print file (e.g., a STL file) to the printer 112a, which may then print the aircraft (or component thereof).

The various aspects of the aircraft design optimization architecture 200 will now be described with reference to FIGS. 1 through 4, where the following abbreviations are used:

| Data/Data Structure | Abbreviation | General Description/Example |
|---|---|---|
| Aircraft | A | Vehicle geometry, aerodynamic performance, propulsion system, atmospheric environment, etc. |
| Objective Data | OD | Optimizer objective function data |
| Model Outputs | $MO_n$ | Depending on type of model. For example: Vehicle Sizing model - Mission Performance, vehicle maximum takeoff weight, fuel burn. |

-continued

| Data/Data Structure | Abbreviation | General Description/Example |
|---|---|---|
| | | Vehicle price model - total vehicle cost, cost/hour, maintenance cost. Operational analysis model - survival probability, probability of mission success. |
| Mission | M | Defines flight plan or flight profile for aircraft. |
| Mission History | MH | Profiles of engine, aerodynamic, and other calculated parameters. Instantaneous fuel burn. Altitude, airspeed, and range profiles. This is a collection of Segment Histories. |
| Optional Variables | OV | Variables that are not required for the proper functionality of the code but may be used to described behavior that is more detailed. For example, load factors due to steady turning flight or a maximum allowable throttle percentage. |
| Data Object | DO | Structure containing the input or output of a given module. |
| Initial Aircraft | IA | An initial definition of an aircraft for the start of the sizing/optimization process. This aircraft may not be physical realizable per the constraints imposed by the sizing/optimization model. |
| Initial Mission | IM | Initial mission profile of the aircraft. This may not agree with the constraints imposed by the sizing or optimizer. For example, the total range may not be equivalent to the desired total range. |
| Residual Data | RD | Data objects which specify the residuals of the various abstractions; this is used to converge the vehicle parameters to a physically realizable design point that meets all constraints. |
| Object History | OH | History of all abstraction objects computed over the course of a mission. |
| Segment Input | SI | Input parameters which define a mission segment; examples include initial and final altitude, speed, or duration. |
| Segment History | SH | Profiles of engine, aerodynamic, and other calculated parameters, including instantaneous fuel burn, over the course on one segment. Altitude, airspeed, and range profiles. |
| Drag Data | DD | The Data Object corresponding to the output of the Drag Abstraction. |
| Atmosphere Data | AtmD | The Data Object corresponding to the output of the Atmosphere Abstraction. |
| Power Data | PD | The Data Object corresponding to the output of the Power Abstraction. |
| Attribute Data | AD | The Data Object corresponding to the output of the Additional Attributes Abstraction. |

Figure 2:
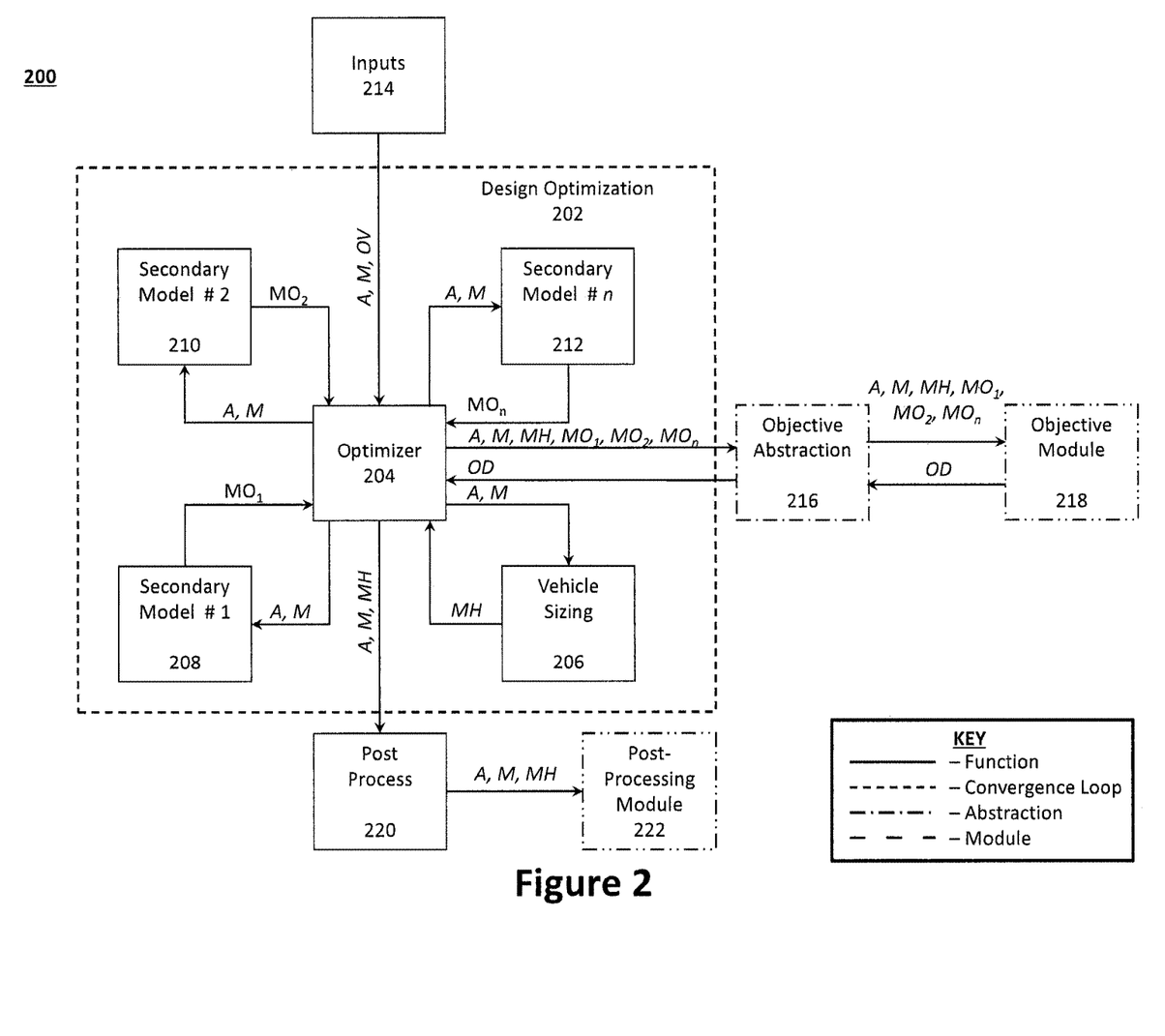
FIG. 2 illustrates a block diagram of an example aircraft design optimization architecture for the aircraft design optimization system.

The aircraft design optimization architecture 200 is based on several core building blocks, which are generally represented as classes or functions within the program. The aircraft design optimization architecture 200 operates using data inputs from an input circuit 214. A first input data type is aircraft (A) data, which contains the details of the vehicle, such as geometry, aerodynamic performance, propulsion system, the atmospheric environment, etc. A second input data type is the mission (M) data structure, which defines a flight profile to be flown by an vehicle defined by the aircraft (A) data. The mission (M) data structure may include an ordered list of segments, which define the various phases of flight, and the force balances involved. Example segment types include climb (e.g., set to a best climb speed), cruise, cruise-climb (e.g., set to a constant Mach number/lift coefficient (CO), descent (e.g., set to idle throttle and/or a fixed glide scope), loiter (e.g., set to best endurance speed), etc. Another input data type includes optional variables (OV), such as a maximum allowable throttle percentage or a specified turning load factor. As the aircraft (A) data and mission (M) data structures are communicated to the various modules, they are updated based on the function of the given module.

FIG. 2 illustrates an example aircraft design optimization architecture 200. As illustrated, the aircraft design optimization architecture 200 generally comprises an input circuit 214 to provide input data, a design optimization convergence loop 202, an objective abstraction 216, an objective module 218, a post-processing circuit 220, and a post-processing module 222. The aircraft design optimization architecture 200 employ abstraction, which may be an explicit representation of a component (or portion) of the aircraft system, such as drag, power, weight, etc. An abstraction generally includes two parts—an abstraction handler, which is the function that is called to access the abstraction, and the abstraction data object (ADO), which is a class that contains the data associated with that particular abstraction. Abstractions form the link between segments of the mission and modules. An example module might include a wetted area drag building, which takes in vehicle geometry and calculates the drag at a specified flight condition. Modules can also be wrappers for external sources that are brought into the analysis loop by standalone programs such as engine decks, flight test data, or AVL tree.

The design optimization convergence loop 202 may comprise an optimizer circuit 204 to receive input data from input circuit 214 and to output data to a post-processing module 222 (via a post-processing circuit 220). This optimization loop may contain on arbitrary number of analysis circuits within it. For example, the optimizer circuit 204 may receive from input circuit 214 aircraft (A) and mission (M) data, as well the operation variable (OV) data. To generate the output data, the optimizer circuit 204 is operatively coupled with a n module 218 (via an objective abstraction 216), a vehicle sizing circuit 206, and secondary model circuit_n 212 to exchange various data sets and structures. An objective in this context refers to the optimization objective function; the quantity that the optimizer is seeking to minimize. Examples include, without limitation, vehicle maximum takeoff weight, fuel burn over a given mission, or vehicle purchase cost. The secondary model circuits comprise an analysis that may take place in parallel with the vehicle sizing. These types of analysis can include but are not limited to; operational analysis, vehicle reliability analysis, vehicle operating and purchase cost analysis, and maintainability analysis. The optimizer circuit may use the results of these secondary analyses to change various parameter inputs to the vehicle sizing circuit, and resize the vehicle. The outputs of the vehicle sizing circuit are combined with the outputs of the secondary model circuits in the objective module to determine an objective function, such as cost per pound or total mission probability of success. It should be noted that secondary models are not required; the objective function may be a parameter such as fuel burn or maximum takeoff weight.

The design optimization convergence loop 202 is not limited to a predetermined number of secondary model functions. Therefore, the design optimization convergence loop 202 is illustrated as having first, second, and $n^{th}$ secondary model functions, where secondary model function n represents the $n^{th}$ secondary model function in the design optimization convergence loop 202. A post-processing module 222 is a special case of modules, as there is no explicit post-processing abstraction. The post-processing module 222 is very versatile and may be used for, inter alia, writing to output files or creating graphs. However, unlike most other modules they are highly tied to the level of fidelity in other modules, and as such are likely only compatible with a certain subset of modules. This makes documentation of the required inputs important for post-processing modules 222 to prevent errors.

The novel relationship between segments, modules, and abstractions facilitates the aircraft design optimization architecture 200. A segment defines the relationship between the abstractions (e.g., power=drag), therefore one segment can access many abstractions. An abstraction passes data between the modules, which contain the actual model of the system being simulated, and the segment. An abstraction is compatible with any module that outputs data in the specified abstraction data object format. The module that feeds into an abstraction is configurable in the input file.

Figure 4:
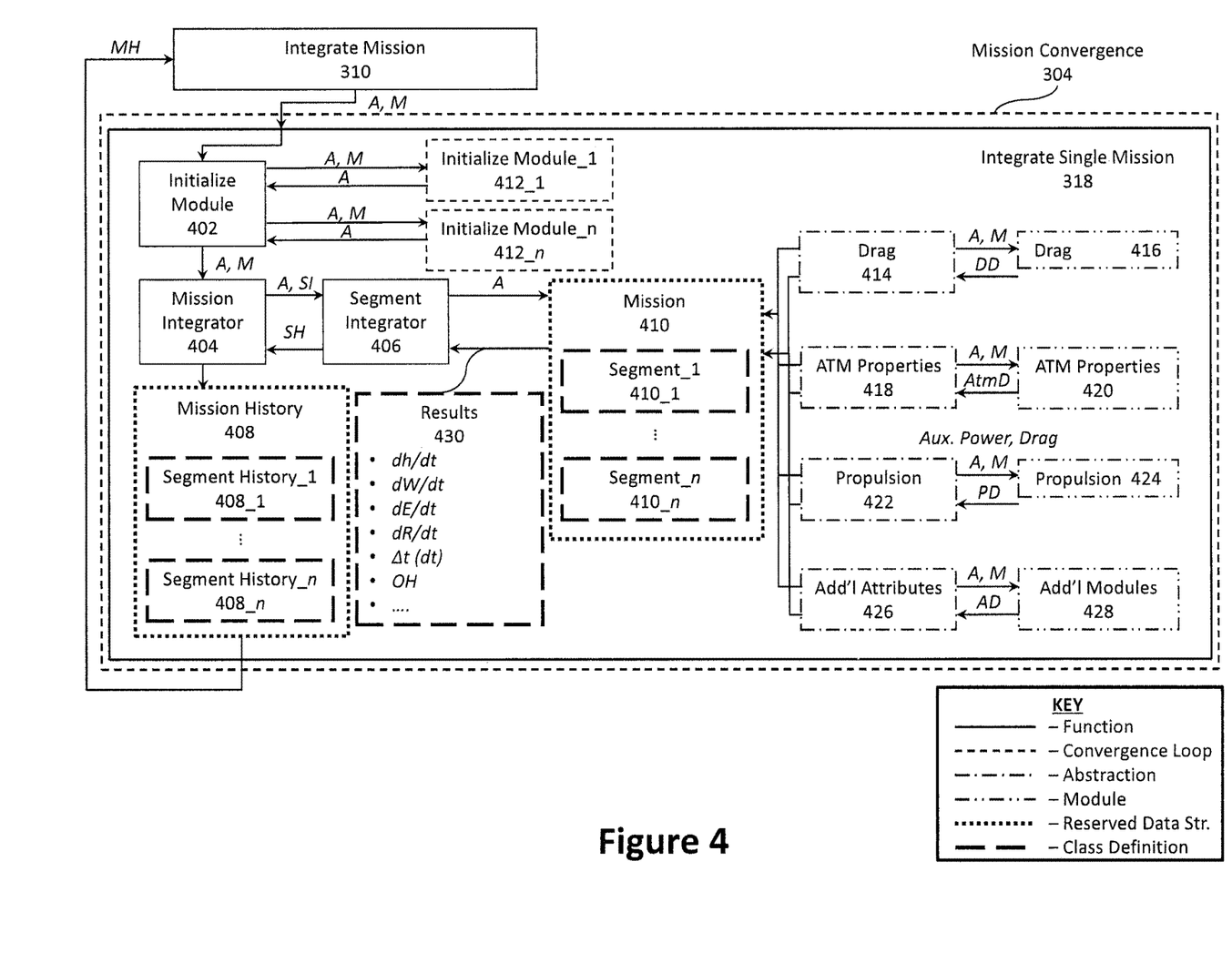
FIG. 4 illustrates a block diagram of an example mission integration circuit configured within mission convergence loop.

An advantage of the aircraft design optimization architecture 200 is that it makes it very easy to change the modules, and hence the level of fidelity that is being simulated. In the case of a drag module 416 (discuss below), for example, a simple module could be initially written that uses a parabolic drag polar to provide a quick drag value estimate. This could be replaced by a more detailed drag buildup, an AVL model, CFD data, or flight test results as they become available without changing any other aspects of the code except for the drag module, as long as the output is formatted in the correct ADO. ADOs include several required attributes. Building upon the drag abstraction as an example, each drag ADO must have a value for $CD_{Total}$, as well as a value for $CD_{Profile_{Wing}}$ and $CD_{Profile_{Fuselage}}$, to support boundary layer ingestion (BLI). However, it could contain much more data ($CD_{induced}$, for example). This is to allow for any fidelity of modeling to be done. Data calculated by the module beyond what is required for performing mission integration is tracked over the course of the simulated mission, and stored for post-processing.

In operation, the optimizer circuit 204 communicates aircraft (A) and mission (M) data from the input circuit 214 (e.g., initial aircraft (IA) data and initial mission (IM) data) to each of the vehicle sizing circuit 206, the secondary model circuit_1 208, the secondary model circuit_2 210, and the secondary model circuit_n 212. In response, the vehicle sizing circuit 206 sends mission history (MH) data to the optimizer circuit 204, while the secondary model circuit_1 208, the secondary model circuit_2 210, and the secondary model circuit_n 212 sends model output data (e.g., $MO_1$, $MO_2$, and $MO_n$) to the optimizer circuit 204. The optimizer circuit 204 communicates the aircraft (A) and mission (M) data and the models output (MO, $MO_1$, and $MO_n$) data to the objective module 218 via the objective abstraction 216. The optimizer circuit 204, in response, receives from the objective module 218 (via the objective abstraction 216) objective data (OD).

The output data from the optimizer circuit 204 to the post-processing module 222 may include, for example, aircraft (A), mission (M), and mission history (MH) data.

Figure 3:
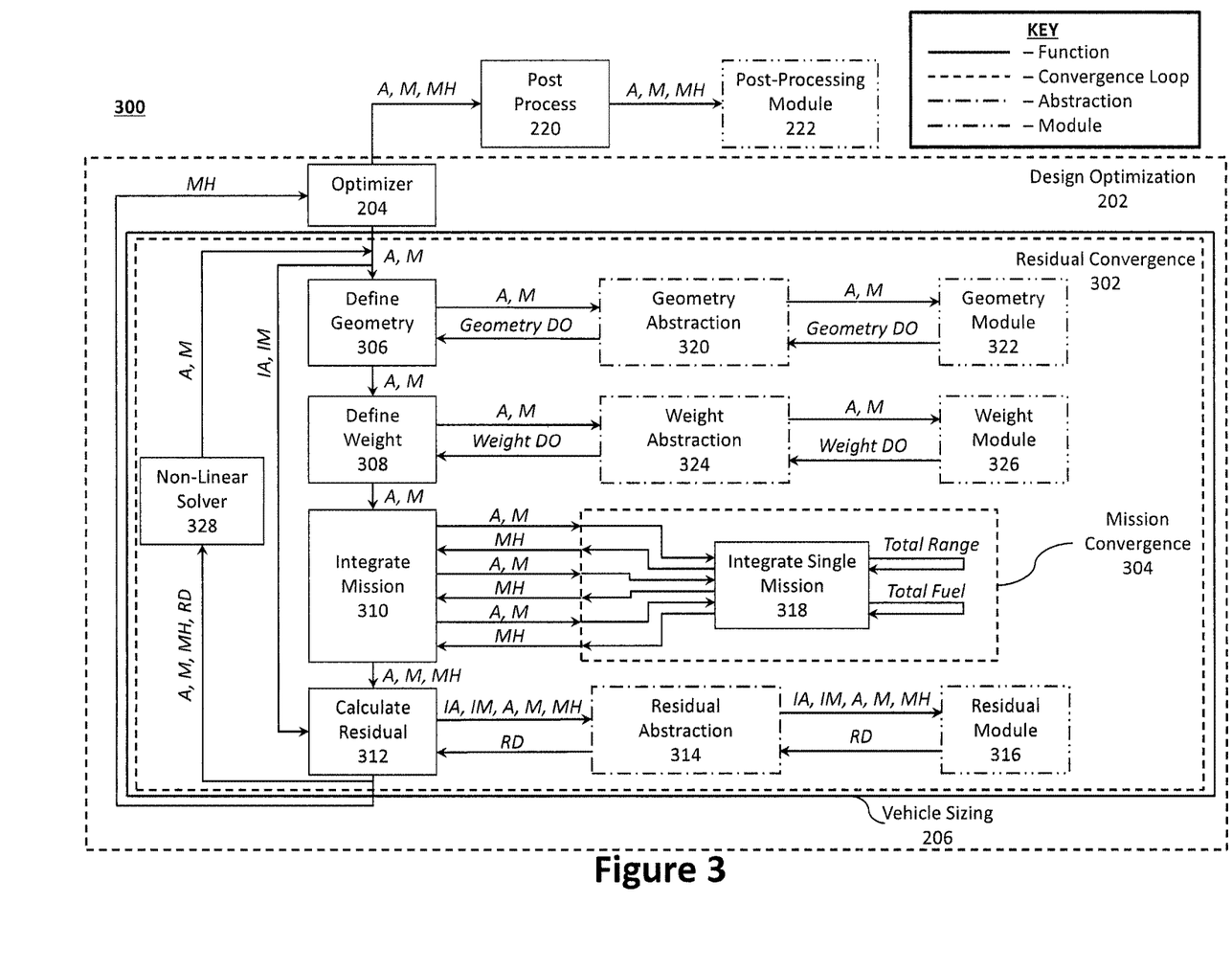
FIG. 3 illustrates a flow-block diagram of an example architecture for a vehicle sizing circuit of the aircraft design optimization architecture.

FIG. 3 illustrates an example architecture 300 for the vehicle sizing circuit 206. As illustrated, the vehicle sizing circuit 206 generally comprises, within a residual convergence loop 302, a geometry definition circuit 306, a weight definition circuit 308, a mission integration circuit 310, a residual calculation circuit 312, and a non-linear solver circuit 328.

The geometry definition circuit 306 communicates the aircraft (A) and mission (M) data from the optimizer circuit 204 to a geometry module 322 via a geometry abstraction 320. In response, the geometry definition circuit 306 receives from the geometry module 322 a geometry data object (DO). The geometry definition circuit 306 outputs aircraft (A) and mission (M) data reflecting the geometry data object (DO) from the geometry module 322 to a weight definition circuit 308.

The weight definition circuit 308 communicates the aircraft (A) and mission (M) data from the geometry definition circuit 306 to a weight module 326 (via a weight abstraction 324). In response, the weight definition circuit 308 receives from the weight module 326 a weight data object (DO). The weight definition circuit 308 outputs aircraft (A) and mission (M) data reflecting the weight data object (DO) from the weight module 326 to the mission integration circuit 310.

The mission integration circuit 310 communicates the aircraft (A) and mission (M) data from the weight definition circuit 308 to a mission integration circuit 318. The mission integration circuit 318 may be configured within mission convergence loop 304. The mission integration circuit 318 uses the aircraft (A) and mission (M) data from the weight definition circuit 308 to generate mission history (MH) data based on fuel and range requirements. In response, the mission integration circuit 310 receives from the mission integration circuit 318 the mission history (MH) data.

The residual calculation circuit 312 communicates the aircraft (A), mission (M), and mission history (MH) data from the mission integration circuit 310 to a residual module 316 (via a residual abstraction 314, which may use a numpy array). The residual calculation circuit 312 also communicates initial aircraft (IA) and initial mission (IM) data from the input circuit 214 (via the optimizer circuit 204) to the residual module 316 (via the residual abstraction 314). In response, the residual calculation circuit 312 receives from the residual module 316 the residual data (RD) value.

Vehicle convergence is the higher-level vehicle sizing convergence loop, designed to adjust a specified vehicle parameter to close on a given mission. An example might be adjusting the fuselage length (and thereby fuel capacity) to converge on the fuel required to fly a given mission. The vehicle convergence loop employs a residual abstraction 314, which accesses the custom residual module 316. The residual module 316 can be configured for each sizing case, and the vehicle convergence loop operates by driving that residual to zero. The ability to define custom residuals provides flexibility to the convergence loop. The residual could be, for example, the difference between mission fuel required and aircraft fuel capacity. In another example, the residual could be a difference between an initial and calculated maximum takeoff weight in a more typical weight convergence, or the difference between a specified battery capacity and the power required to fly the mission.

Depending on the residual data (RD) value, the residual calculation circuit 312 may either output the mission history (MH) data to the optimizer circuit 204 or output the aircraft (A), mission (M), and mission history (MH) data and the residual data (RD) value to non-linear solver circuit 328. For example, if the residual data (RD) value is at or near zero, the residual calculation circuit 312 may output the mission history (MH) data to the optimizer circuit 204, otherwise the residual calculation circuit 312 outputs the aircraft (A), mission (M), and mission history (MH) data and the residual data (RD) value to non-linear solver circuit 328. The non-linear solver circuit 328 operates to drive the residual data (RD) value to zero by outputting the aircraft (A) and mission (M) data to the geometry definition circuit 306, where the process repeats until the residual data (RD) value is zero or near zero.

A difference between mission convergence loop 304 and vehicle convergence include that mission convergence loop 304 is simpler than vehicle convergence, and best suited to matching a multi-segment mission to easily defined parameters that are known beforehand, like total range or fuel capacity. Mission convergence loop 304 also uses a simple linear solver for convergence, and does not allow the specification of custom residuals. Vehicle convergence uses a non-linear solver circuit 328 (e.g., fsolve), which provides for a robust, but slower, process. For example, the non-linear solver circuit 328 is better suited for sizing a specific vehicle parameter to a given mission. Vehicle convergence can also be used to close a mission around a vehicle, which may be beneficial when there is a mission with highly non-linear characteristics or a complex residual.

FIG. 4 illustrates an example architecture for the mission integration circuit 318 of the mission convergence loop 304, which is an central aspect of defining missions in the aircraft design optimization architecture 200. As illustrated, the mission integration circuit 318 generally comprises a module initiation circuit 402, a mission integrator circuit 404, and a mission history data structure 408. The module initiation circuit 402 communicates the aircraft (A) and mission (M) data from the mission integration circuit 310 to one or more convergence loops, such as module initialization convergence loop_1 412_1 through module initialization convergence loop_n 412_n. The aircraft (A) data is updated and returned to the module initialization circuit 402.

The module initiation circuit 402 communicates, in addition to the mission (M) data from the mission integration circuit 310 to the mission integrator circuit 404, the aircraft (A) data from the one or more convergence loops to the mission integrator circuit 404. For each segment in a given mission, the mission integrator circuit 404 communicates the aircraft (A) and segment input (SI) data from the mission integrator circuit 404 to the segment integrator circuit 406, which passes the aircraft (A) data to the various modules (e.g., drag module 416, atmosphere module 420, propulsion module 424, additional attributes module 428). The segment input (SI) data may include, for example, segment_type, num_subsegments, initial_altitude, initial_range, initial_weight, initial_energy, is_free_segment, is_starting_segment, is_ending_segment, Propulsion_Inputs, All_Abstraction_Inputs, as well as Additional inputs, specific to each segment type. For example, the following data may be set: segment_type='LevelCruise'; num_subsegments=64; constraint='fixed_weight'; delta_weight=4700; flight_conditon='Mach'; mach=0.75; Initial_altitude=39000; Propulsion_Inputs.power_setting='Specified', etc. There may also be a coupling between the propulsion module 424 and the drag module 416 (e.g., in the BLI case). This coupling is unlikely to be used most non-BLI cases, but it allows for the possibility that these may be linked.

The various modules outputs results 430 to the segment integrator circuit 406. The results 430 may include, for example, altitude/height change over time (dh/dt), weight change over time (dW/dt), energy change over time (dE/dt), range change over time (dR/dt), change in time (ΔT), object history (OH) data, etc. The segment integrator circuit 406 integrates the results 430 and communicates a segment history (SH) data to the mission integrator circuit 404 to create a mission history data structure 408. The segment integrator circuit 406 is called by the mission integrator circuit 404, and integrates the results of a single segment. The segment integrator circuit 406 breaks the segment up into the specified number of sub-segments and integrates the weight changed, energy used, distance and altitude covered, and time over the course of that segment. At each time step, it calls the sub-segment function of the specific Segment Class, which returns the Results data structure. That data structure contains dR/dt, dW/dt, dh/dt, etc., as well as the time step and all abstraction data objects calculated during that sub-segment.

The mission integrator circuit 404, for each segment, determined drag, atmospheric properties, propulsion, etc. To determine drag, the segment integrator circuit 406 may output aircraft (A) and mission (M) data from the mission integrator circuit 404 to a drag module 416 via a drag abstraction 414. The required attributes of the drag abstraction 414 may include, for example, CD_total, CDp_fuse, CDp_wing, etc., where CD is the coefficient of drag (CD). The drag module 416, in response, returns the drag data (DD) to the segment integrator circuit 406.

To determine atmosphere information, the segment integrator circuit 406 may output aircraft (A) and mission (M) data to an atmosphere module 420 via an atmosphere abstraction 418. The required attributes of the atmosphere abstraction 418 may include, for example, ρ (rho-density), P (pressure), T (temperature), a (speed of sound), μ (dynamic viscosity), etc. The atmosphere module 420, in response, returns the atmosphere data (AtmD) to the segment integrator circuit 406.

To determine propulsion needs/information, the segment integrator circuit 406 may output aircraft (A) and mission (M) data to a propulsion module 424 via a propulsion abstraction 422. The required attributes of the propulsion abstraction 422 may include, for example, dW/dt, dE/dt, etc. The propulsion module 424, in response, returns the power data (PD) to the segment integrator circuit 406. As with drag, atmosphere, and power, additional attributes may be evaluated, whereby the segment integrator circuit 406 may output aircraft (A) and mission (M) data to an additional attributes module 428 via an additional attributes abstraction 426. The additional attributes module 428, in response, returns the additional attributed data (AD) to the segment integrator circuit 406.

The mission integrator circuit 404 integrates the segment history (SH) data to generate the mission history (MH) data, which is passed to the mission history data structure 408. Within the mission history data structure 408, various parameters for the aircraft may be stored for each segment of the mission history data (e.g., segment history convergence loop_1 408_1 through segment history convergence loop_n 408_n). The mission history data structure 408 is then communicated to the mission integration circuit 310 as the mission history (MH) data. The segments may define both the mission that is being simulated, as well as defining how the abstractions relate to each other. A segment may include of two classes. The first class may be a segment input (SI) data class (e.g., Segment Inputs), which defines all the inputs that go into each segment. A list of segment input (SI) data is contained in the profile list in the mission history data structure. The second class may be a class specific to each segment type, such as climb, cruiseclimb, levelcruise, fixedfraction, descent, etc.

Figure 6:
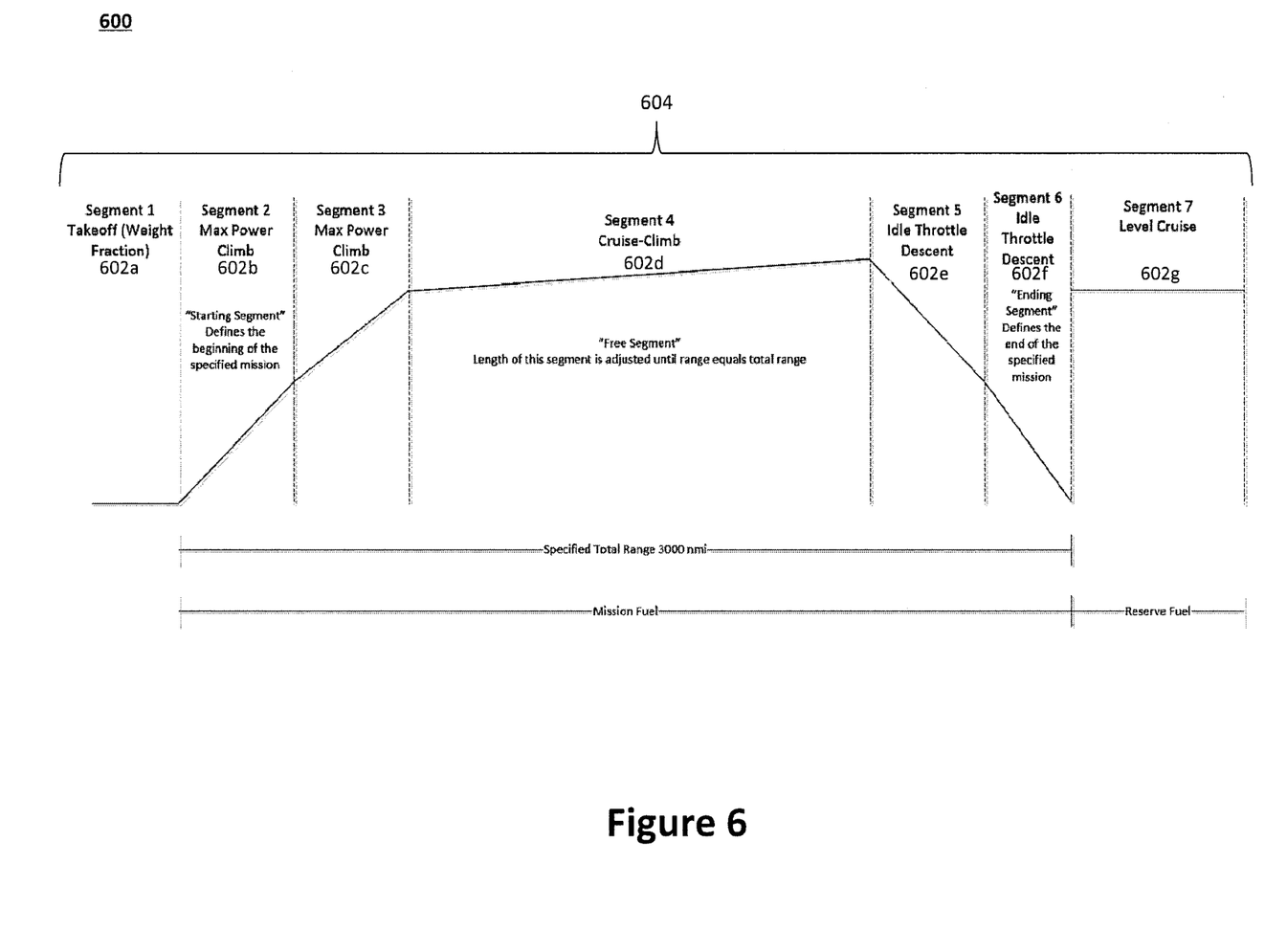
FIG. 6 illustrates an example commercial aircraft mission with seven segments.

In the simplest case, with reference to FIG. 3, each segment can be defined independently of one another, where the total range and fuel burn is integrated over the mission. This approach is acceptable in many cases, but may not be sufficient where the lengths of the legs (e.g., segments) may not be known ahead of time. For example, FIG. 6 illustrates an example commercial aircraft mission with seven segments (segment 1 602a through segment 7 602g). The specified mission range is the total distance between the takeoff airport and the landing airport, but the length of the final two segments (i.e., segment 6 602f and segment 7 602g) is a function of the weight at the end of the cruise-climb segment, which means that the correct length for the cruise-climb segment cannot be known until after the integration is complete.

To address this issue, a free segment 602d is designated within the mission profile 604. The mission is simulated multiple times and the length of this segment is changed such that the entire mission range, which is defined as the points between the "starting" and "ending" segments, achieves a target. This approach generally converges in a small number of iterations (e.g., 2-3) when provided with a reasonable close initial presumption. Apart from range, a mission can also be converged on a total energy used or weight change. This concept also allows reserve fuel missions to be easily included, as they are included in the total mission profile after the ending segment.

The mission convergence loop 304 is controlled by a parameter that controls the operation of the mission convergence loop 304 loop, which may provide possible options. The aircraft design optimization architecture 200 controls the tolerance to within which the mission is converged, where the default value may be, for example, 0.1%. The possible options may include, for example, single run, target range, target energy, target time, and target weight. In the single run option, the mission is simulated exactly as specified in the input file.

In the target range option, the final range parameter of the free segment 602d is modified until the total range between the start and ending segments matches the value specified by target range parameter for the aircraft. The segment must have the constraint fixed range.

In the target energy option, the energy delta (difference) parameter of the free segment 602d is modified until the total energy used between the start and ending segments matches the value specified by target energy parameter for the aircraft. The segment must have the constraint fixed energy. In the target time option, the final time parameter of the free segment 602d is modified until the total time between the start and ending segments matches the value specified by target time parameter for the aircraft. The segment must have the constraint fixed time. In the target weight option, the weight delta (difference) parameter of the free segment 602d is modified until the total weight change between the start and ending segments matches the value specified by target weight parameter for the aircraft. The Segment must have the constraint fixed delta weight.

Figure 5:
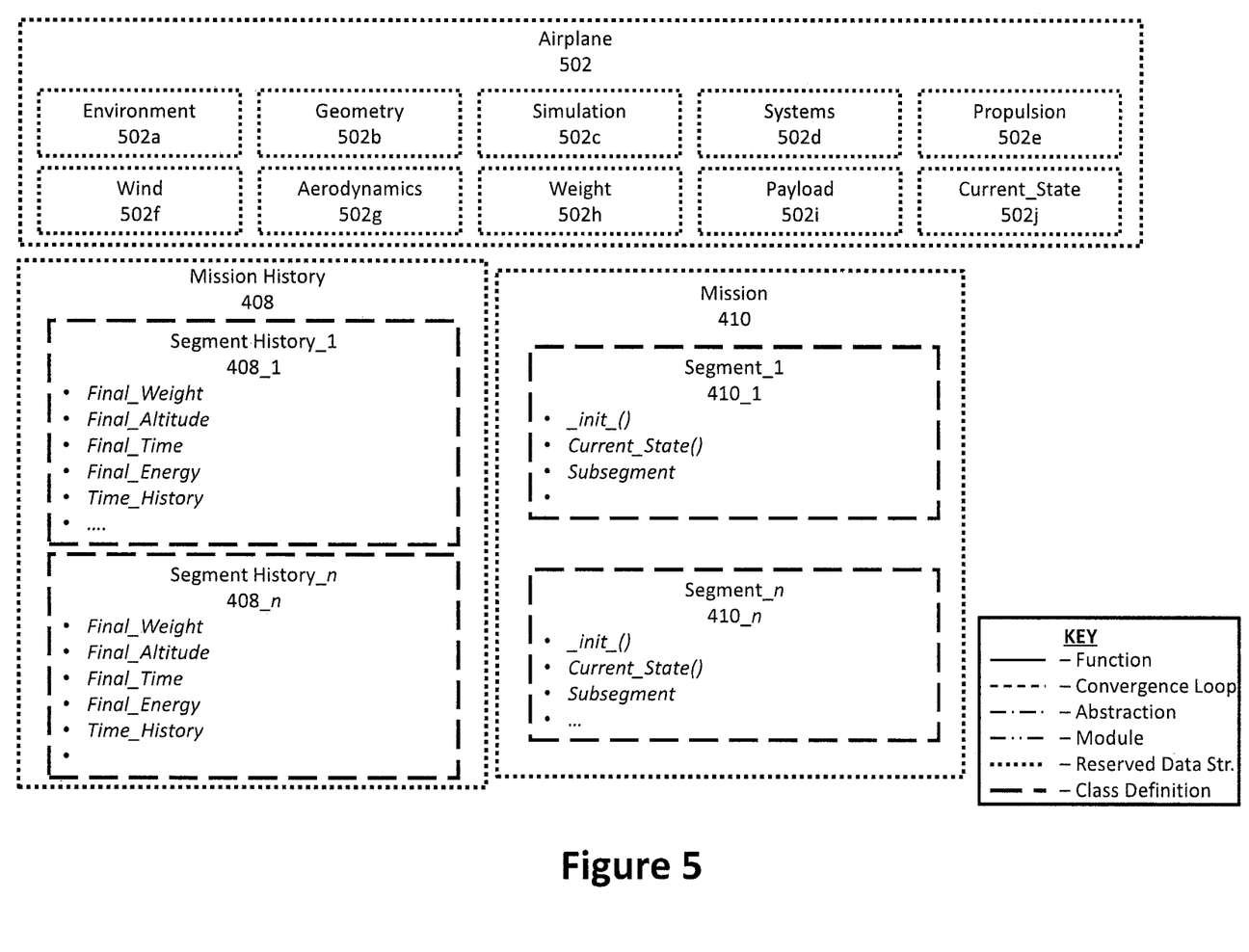
FIG. 5 illustrates example data structures for mission history, mission data, and aircraft data.

FIG. 5 illustrates example data structures for each of the mission history data structure 408, mission data structure 410, and aircraft data structure 502 (e.g., aircraft (A) data). With regard to the mission history data structure 408, the various parameters for each segment (e.g., segment history convergence loop_1 408_1 through segment history convergence loop_n 408_n) may include, for each segment, inter alia, final weight, final altitude, final time, final history, time history, etc.

With regard to the mission data structure 410, each segment class (e.g., mission convergence loop_1 410_1 through mission convergence loop_n 410_n) of the mission data structure 410 may include various parameters, such as class initialization (_init_( )), the current state (current_state( )), sub segment (subsegment( )), flight angle information (update_flight_path_angle), etc.

Finally, with regard to the aircraft (A) data, the aircraft data structure 502 contains all the information required for defining a vehicle, and any inputs needed to sub-modules. The aircraft data structure 502 may include, inter alia, environment data 502a, geometry 502b, simulation 502c, systems 502d, propulsion 502e, wind 502f, aerodynamics 502g, weight 502h, payload 502i, current_state 502j, etc. Each substructure has a small number of required attributes (e.g., Aerodynamics.CD_total), but can have an arbitrary number of nested substructures (e.g., Airplane.Geometry.Main_Wing.Aileron.planform_area). Inputs should be consistent with the modules being used, but does not affect the rest of the code. Moreover, additional substructures can be added without breaking existing functionality.

Figure 7:
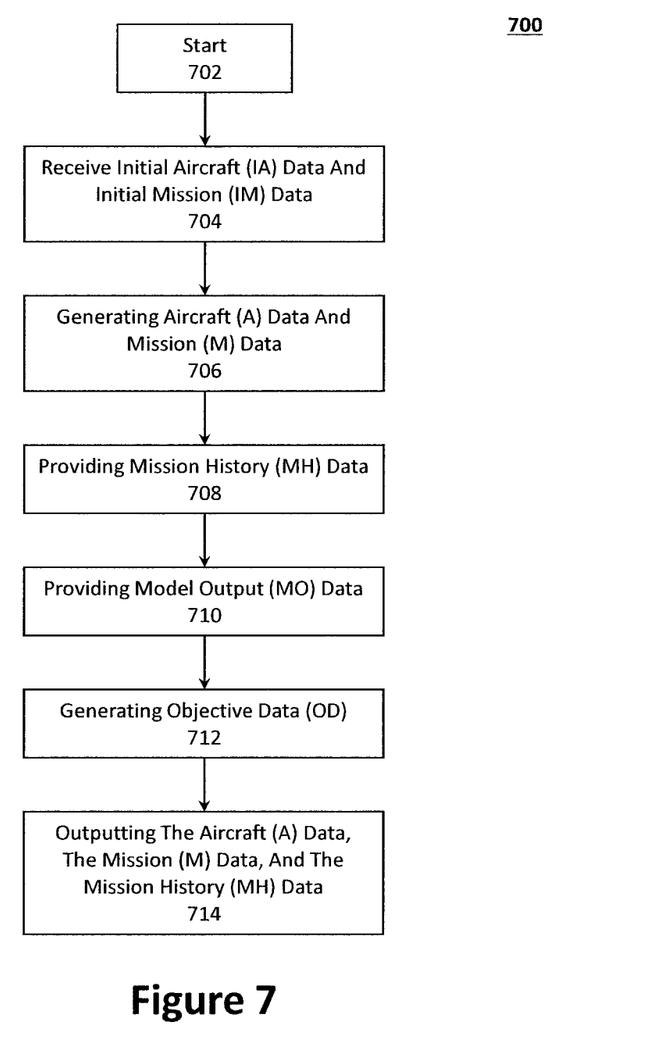
FIG. 7 illustrates a method for optimizing an aircraft design using an aircraft design optimization system in accordance with one example.

FIG. 7 illustrates a method 700 for optimizing an aircraft design in accordance with one example. Upon start up at step 702 of the aircraft design optimization system 100, the optimizer circuit 204 may receive at step 704 initial aircraft (IA) data and initial mission (IM) data relating to an initial aircraft design for an aircraft. The initial aircraft (IA) data may include, for example, an aircraft data structure 502, while the initial mission (IM) data may include, for example, a mission data structure 410. At step 706, a processor-controlled design optimization convergence loop 202 may be used to generate aircraft (A) data and mission (M) data relating to a modified aircraft design for the aircraft.

At step 708, the vehicle sizing circuit 206 may provide mission history (MH) data to the optimizer circuit 204 based at least in part on the initial aircraft (IA) and initial mission (IM) data. In certain aspects, the processor-controlled design optimization convergence loop 202 employs a vehicle sizing circuit 206 and a secondary model circuit (e.g., secondary model circuit_1 208, the secondary model circuit_2 210 . . . the secondary model circuit_n 212) operatively coupled with the optimizer circuit 204. The vehicle sizing circuit 206 may employ a residual convergence loop 302 to modify aircraft (A) data and mission (M) data. For example, as described above, the vehicle sizing circuit 206 may comprise a geometry definition circuit 306, a weight definition circuit 308, a mission integration circuit 310, a residual calculation circuit 312, and/or a non-linear solver circuit 328.

The geometry definition circuit 306 may be configured to modify the aircraft (A) data and mission (M) data as a function of a geometry data object (DO) (e.g., from the geometry module 322). The weight definition circuit 308 may be configured to modify the aircraft (A) data and mission (M) data as a function of a weight data object (DO). The weight definition circuit 308 may be configured to generate the mission history (MH) data as a function of a fuel requirement or a range requirement of the aircraft. The mission integration circuit 310 may be configured to generate the mission history (MH) data as a function of the aircraft (A) data and mission (M) data via a mission convergence loop. The mission convergence loop may employ, for a given mission, drag abstraction 414, atmosphere abstraction 418, and propulsion abstraction 422. The residual calculation circuit 312 may be configured to generate a residual data (RD) value as a function of the initial aircraft (IA) data, the initial mission (IM) data, the mission history (MH) data, the aircraft (A) data, and the mission (M) data.

The residual calculation circuit 312 may be configured to output the modified aircraft (A) data and mission (M) data as a function of the residual data (RD). For example, if the residual data (RD) value is substantially zero, the residual calculation circuit 312 may be configured to output modified aircraft (A) data and mission (M) data to the optimizer circuit 204. However, the residual data (RD) value is not substantially zero, the residual calculation circuit 312 may be configured to output modified aircraft (A) data and mission (M) data to the non-linear solver circuit 328. In this case, the non-linear solver circuit 328 may configured to adjust the modified aircraft (A) data and mission (M) data until the residual data (RD) value is substantially zero (e.g., as illustrated and described in connection with the diagram of FIG. 3).

At step 710, the secondary model circuit may provide model output (MO) data to the optimizer circuit 204 based at least in part on the initial aircraft (IA) and initial mission (IM) data. At step 712, an objective module may generate objective data (OD) reflecting an objective function based at least in part on the aircraft (A) data, the mission (M) data, the mission history (MH) data, and the model output (MO) data received from the optimizer circuit 204. In certain aspects, the objective module may be operatively coupled with the optimizer circuit 204. The objective module may be operatively coupled with the optimizer circuit 204 via at least one abstraction layer. At step 714, the optimizer circuit 204 may output the aircraft (A) data, the mission (M) data, and the mission history (MH) data to a post-processing circuit 220 based at least in part on the objective data (OD).

Although various embodiments have been described with reference to a particular arrangement of parts, features, and like, these are not intended to exhaust all possible arrangements or features, and indeed many other embodiments, modifications, and variations will be ascertainable to those of skill in the art. Thus, it is to be understood that the disclosure may therefore be practiced otherwise than as specifically described above. The above-cited patents and patent publications are hereby incorporated by reference in their entirety.

What is claimed is:

1. An aircraft design optimization system comprising:
    an optimizer circuit configured to receive initial aircraft (IA) data and initial mission (IM) data relating to an initial aircraft design for an aircraft;
    a vehicle sizing circuit and a secondary model circuit operatively coupled with the optimizer circuit to generate, via a processor-controlled design optimization convergence loop, aircraft (A) data and mission (M) data relating to a modified aircraft design for the aircraft,
        wherein the vehicle sizing circuit is configured to provide mission history (MH) data to the optimizer circuit and the secondary model circuit is configured to provide model output (MO) data to the optimizer circuit based at least in part on the initial aircraft (IA) and initial mission (IM) data; and
    an objective module operatively coupled with the optimizer circuit and configured to generate objective data (OD) reflecting an objective function based at least in part on the aircraft (A) data, the mission (M) data, the mission history (MH) data, and the model output (MO) data received from the optimizer circuit,
        wherein the optimizer circuit configured to output the aircraft (A) data, the mission (M) data, and the mission history (MH) data to a post-processing circuit based at least in part on the objective data (OD).

2. The aircraft design optimization system of claim 1, wherein the objective module is operatively coupled with the optimizer circuit via at least one abstraction layer.

3. The aircraft design optimization system of claim 1, wherein the initial aircraft (IA) data includes an aircraft data structure and the initial mission (IM) data includes a mission data structure.

4. The aircraft design optimization system of claim 1, wherein the vehicle sizing circuit employs a residual convergence loop to modify aircraft (A) data and mission (M) data.

5. The aircraft design optimization system of claim 4, wherein the vehicle sizing circuit comprises a geometry definition circuit configured to modify the aircraft (A) data and mission (M) data as a function of a geometry data object (DO).

6. The aircraft design optimization system of claim 4, wherein the vehicle sizing circuit comprises a geometry definition circuit, a weight definition circuit, a mission integration circuit, a residual calculation circuit, and a non-linear solver circuit.

7. The aircraft design optimization system of claim 5, wherein the vehicle sizing circuit comprises a weight definition circuit configured to modify the aircraft (A) data and mission (M) data as a function of a weight data object (DO).

8. The aircraft design optimization system of claim 7, wherein the vehicle sizing circuit comprises a mission integration circuit configured to generate the mission history (MEI) data as a function of the aircraft (A) data and mission (M) data via a mission convergence loop.

9. The aircraft design optimization system of claim 8, wherein the mission integration circuit uses a weight definition circuit to generate the mission history (MH) data as a function of a fuel requirement or a range requirement of the aircraft.

10. The aircraft design optimization system of claim 8, wherein the mission convergence loop employs, for a given mission, drag abstraction, atmosphere abstraction, and propulsion abstraction.

11. The aircraft design optimization system of claim 9, wherein the vehicle sizing circuit comprises a residual calculation circuit configured to generate a residual data (RD) value as a function of the initial aircraft (IA) data, the initial mission (IM) data, the mission history (MH) data, the aircraft (A) data, and the mission (M) data.

12. The aircraft design optimization system of claim 11, wherein the residual calculation circuit is configured to output modified aircraft (A) data and mission (M) data to the optimizer circuit if the residual data (RD) value is zero.

13. The aircraft design optimization system of claim 11, wherein the vehicle sizing circuit comprises a non-linear solver circuit, wherein the residual calculation circuit is configured to output modified aircraft (A) data and mission (M) data to the non-linear solver circuit if the residual data (RD) value is not zero, wherein the non-linear solver circuit is configured to adjust the modified aircraft (A) data and mission (M) data until the residual data (RD) value is zero.

14. A method for optimizing an aircraft design, the method comprising:
receiving, via an optimizer circuit, initial aircraft (IA) data and initial mission (IM) data relating to an initial aircraft design for an aircraft;
generating, via a processor-controlled design optimization convergence loop, aircraft (A) data and mission (M) data relating to a modified aircraft design for the aircraft,
wherein the processor-controlled design optimization convergence loop employs a vehicle sizing circuit and a secondary model circuit operatively coupled with the optimizer circuit;
providing, via the vehicle sizing circuit, mission history (MH) data to the optimizer circuit based at least in part on the initial aircraft (IA) and initial mission (IM) data;
providing, via the secondary model circuit, model output (MO) data to the optimizer circuit based at least in part on the initial aircraft (IA) and initial mission (IM) data;
generating objective data (OD), via an objective module, reflecting an objective function based at least in part on the aircraft (A) data, the mission (M) data, the mission history (MH) data, and the model output (MO) data received from the optimizer circuit,
wherein the objective module is operatively coupled with the optimizer circuit; and
outputting, via the optimizer circuit, the aircraft (A) data, the mission (M) data, and the mission history (MH) data to a post-processing circuit based at least in part on the objective data (OD).

15. The method of claim 14, further comprising the step of modifying, via a geometry definition circuit, the aircraft (A) data and mission (M) data as a function of a geometry data object (DO).

16. The method of claim 15, further comprising the step of modifying, via a weight definition circuit, the aircraft (A) data and mission (M) data as a function of a weight data object (DO).

17. The method of claim 16, further comprising the step of generating, via a mission integration circuit using a mission convergence loop, the mission history (MH) data as a function of the aircraft (A) data and mission (M) data.

18. The method of claim 17, wherein the mission integration circuit uses a weight definition circuit to generate the mission history (MH) data as a function of a fuel requirement or a range requirement of the aircraft.

19. The method of claim 17, wherein the mission convergence loop employs, for a given mission, drag abstraction, atmosphere abstraction, and propulsion abstraction.

20. The method of claim 18, further comprising the step of generating, via a residual calculation circuit, a residual data (RD) value as a function of the initial aircraft (IA) data, the initial mission (IM) data, the mission history (MH) data, the aircraft (A) data, and the mission (M) data.

21. The method of claim 20, further comprising the step of outputting, via the residual calculation circuit, modified aircraft (A) data and mission (M) data to the optimizer circuit if the residual data (RD) value is zero.

22. The method of claim 20, further comprising the step of outputting, via the residual calculation circuit, modified aircraft (A) data and mission (M) data to a non-linear solver circuit if the residual data (RD) value is not zero,
wherein the non-linear solver circuit is configured to adjust the modified aircraft (A) data and mission (M) data until the residual data (RD) value is zero.

* * * * *